(12) United States Patent
Basset et al.

(10) Patent No.: US 8,907,827 B2
(45) Date of Patent: Dec. 9, 2014

(54) A/D CONVERTER REFERENCE CALIBRATION

(71) Applicants: Christophe Basset, Pasadena, CA (US); Loc Truong, Pasadena, CA (US); Kevin Stevulak, Pasadena, CA (US)

(72) Inventors: Christophe Basset, Pasadena, CA (US); Loc Truong, Pasadena, CA (US); Kevin Stevulak, Pasadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 0 days.

(21) Appl. No.: 13/907,874

(22) Filed: Jun. 1, 2013

(65) Prior Publication Data

US 2013/0335246 A1  Dec. 19, 2013

Related U.S. Application Data

(60) Provisional application No. 61/654,271, filed on Jun. 1, 2012.

(51) Int. Cl.
*H03M 1/10* (2006.01)
*H03M 1/12* (2006.01)

(52) U.S. Cl.
CPC ............ *H03M 1/1009* (2013.01); *H03M 1/123* (2013.01); *H03M 1/1061* (2013.01)
USPC .......................................... 341/120; 341/155

(58) Field of Classification Search
CPC .................................. H03M 1/12; H03M 1/00
USPC .......................... 341/120, 115, 110, 155, 156
See application file for complete search history.

(56) References Cited

U.S. PATENT DOCUMENTS 8,587,464 B2 * 11/2013 Bonaccio et al. ............. 341/155

\* cited by examiner

*Primary Examiner* — Joseph Lauture
(74) *Attorney, Agent, or Firm* — Law Office of Scott C. Harris, Inc.

(57) ABSTRACT

Calibrating of A/D converters is carried out by obtaining adjustable reference voltages which are used in A/D conversion, comparing a first divided reference voltage of a full range voltage Vref, with a second divided reference voltage of Vref using analog to digital converters that are used in the A/D conversion; and adjusting at least one of said reference voltages to obtain a set ratio between said multiple ones of said reference voltages. The compared values can include a divided version of Vref, e.g., 3/8 Vref.

13 Claims, 3 Drawing Sheets

A/D CONVERTER REFERENCE CALIBRATION

This application claims priority from Provisional application No. 61/654,271, filed Jun. 1, 2012, the entire contents of which are herewith incorporated by reference.

BACKGROUND

A/D converters can be used in many different applications to convert an analog signal into a digital signal. Since there is an analog portion to all A/D converters, that analog portion is often calibrated to make sure that the digital outputs are accurate.

CMOS image sensors may have a column parallel readout using an array of programmable gain amplifiers or PGAs. CMOS image sensors use A/D converters to produce the digital output indicative of the analog input. A typical column parallel image sensor may use successive approximation A/D converters. This requires that the A/D converters maintain a precise ratio in the ratio of $Vref/2^n$, for example Vref, Vref/8 and Vref/32. Those references are sometimes generated on the image sensor chip by D/A converters. The digital control logic on the chip can then adjust those to correct for variations and adjust desired ratio due to mismatches and due to the formation process.

SUMMARY

The present application describes an A/D converter reference calibration system and method.

More specifically, the present application describes a testing and calibration system for A/D converter references, that tests using $m/2^n$*vref, where m and n are whole numbers. One embodiment describes using 3/8 vref in addition to other values.

DETAILED DESCRIPTION

Figure 1:
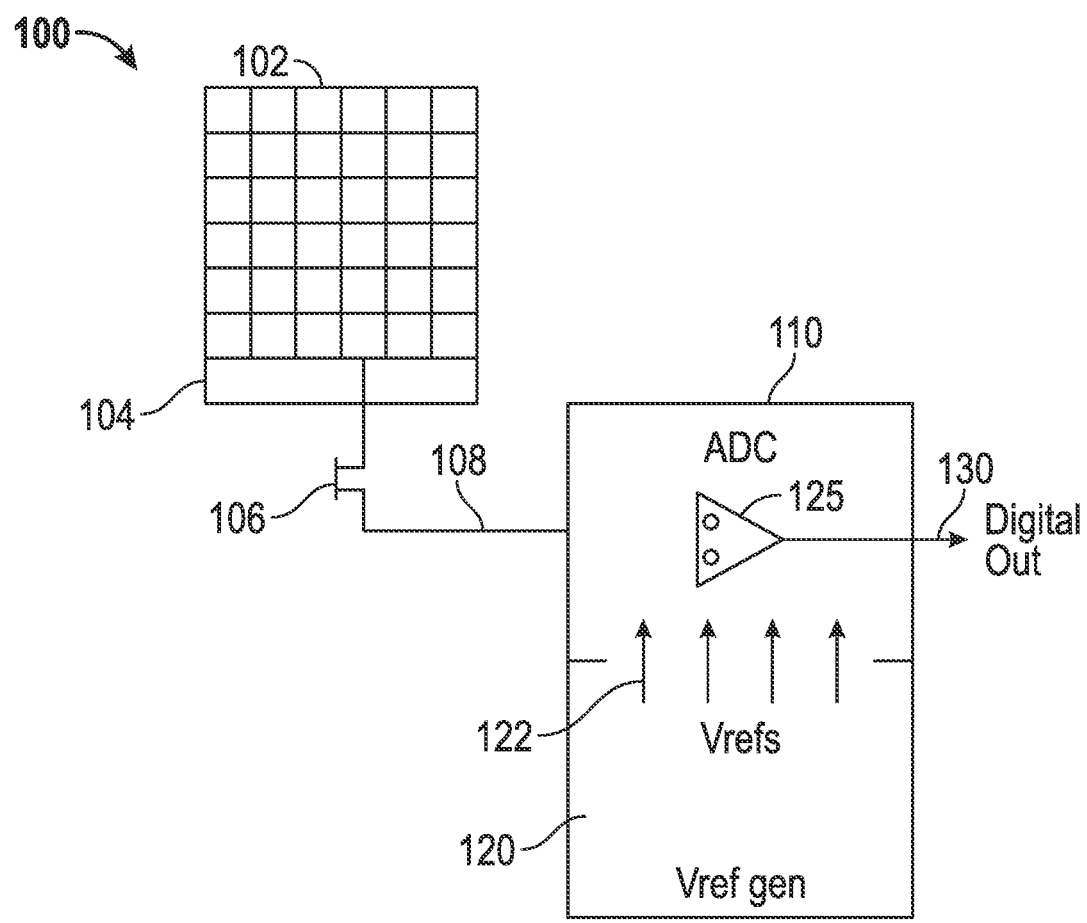
FIG. 1 shows a pixel and A/D converter with voltage references.

FIG. 1 illustrates a block diagram of a CMOS image sensor that has a column parallel readout array. The column parallel array uses A/D converters for conversion. More A/D converters than columns are implemented in the system and the extra A/D converters are used to sample the generated references. The sampled references return a number indicative of the references.

In addition, the highest reference value (Vref) is multiplied by $m/2^n$, where $m/2^n<1$, and m and n are any whole numbers. $m/2^n$ is always less than one, and hence this embodiment divides Vref to some lower value. In an embodiment described herein, m is 3 and n is 3, so Vref is divided to 3/8 Vref, then sampled. Another embodiment multiplies by any rational portion of eighths.

The values are sampled through the additional A/D converters, so that an average can be computed for the values. The vref 3/8, and is used as the reference for the ratio.

The divided values should be compared to the full-scale value, to see if the divided values have been correctly divided. However, the inventors recognized that sampling the full scale vref can produce issues, since if Vref is at its maximum full value, it could clip during the sampling. Therefore, by sampling some fraction of the Vref, this can provide a sampling of the references as done herein.

In an embodiment, 3/8Vref and 1/8Vref are sampled. The digital values indicative of the sample are compared by taking a ratio of the digital values. The goal of this comparison is to get 1/8 to be 1/3 of 3/8. The values are adjusted if this does not properly work, and the values repeated. The ratio is compared until Vref 3/8 is equal to 3 times vref 1/8 (or within a small window to avoid oscillations.).

An analogous operation is executed to adjust Vref/32.

Figure 2:
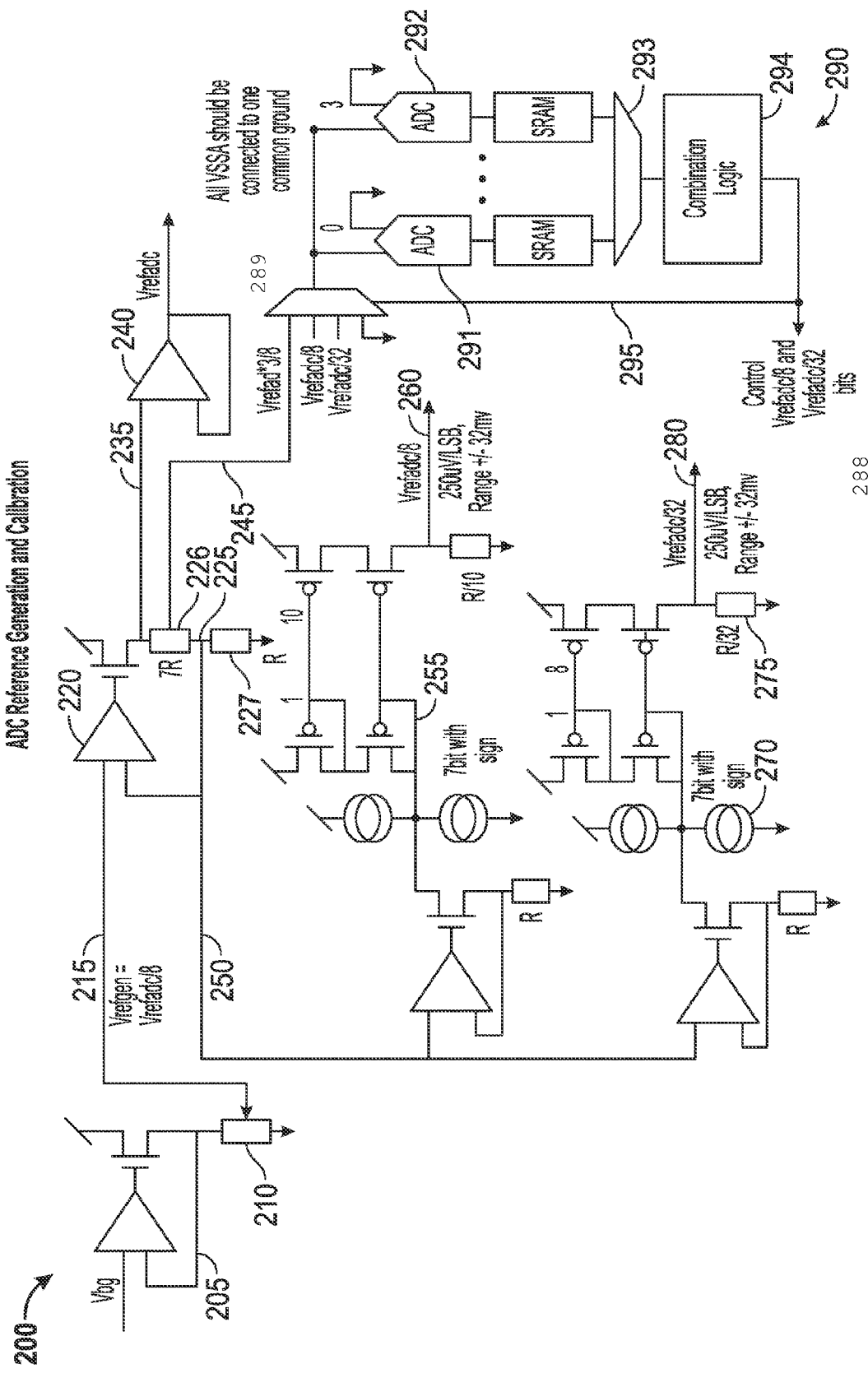
FIG. 2 shows a schematic of a circuit.

FIGS. 1-2 shows an embodiment.

FIG. 1 shows a pixel array 100 which can be any kind of image sensor array, for example an array of CMOS image sensors. Although only a few pixels are shown in the array, there can be many more pixels in the array. Each column 102 of the array may be connected via switching circuitry 104 to a processing part. The processing part may include a source follower 106 which connects each sampled level to an ADC converter assembly 110.

Successive approximation ADC converters rely on comparing the signal to a reference voltage, including to a full-scale reference voltage referred to herein as Vref, and bit divided versions (Vref/2n) of that reference voltage (e.g., Vref/8, Vref/32). One way in which the reference voltage can be created is with a weighted capacitor ladder. In addition, however, the reference voltage can be created in different ways. In general the reference voltage generator 120 may create a number of reference voltages shown in general is 122 by various different means. A comparator 125 compares the input sample 108 with each of the reference voltages. Each bit of the digital output 130 is created by a comparison between the input voltage and the reference voltage.

FIG. 2 shows a way of creating the reference voltages that are used according to an embodiment. A rail power supply voltage 200 is first buffered by a follower 205, and a reference is generated by voltage regulator 210. The voltage regulator 210 can be for example a zener diode or an integrated reference voltage. This creates the reference generated voltage 215 which is itself buffered by buffer amplifier 220. The output of buffer amplifier 220 is divided by a resistive ladder 225. The resistive ladder includes 8 different portions which have the resistance value r.

The voltage output from the buffer 220 is the full range A/D converter Vref shown as 235. This is buffered and output as Vref ADC. Between ladder elements 3 and 4 is an output of 3/8 Vref shown as 245. Between voltage ladders 7 and 8 is output Vref/8 shown as 250. This is buffered by a buffer amplifier 255 to create the final Vref/8 level 260. This is also buffered by a second buffer amplifier 270, and divided by a resistor 275 to create Vref/32 shown as 280.

A calibration logic 290 operates as described above. The switch 289 switches values including Vref 3/8 (line 245) Vref/8 (line 260) and Vref/32 to be sampled by the ADCs 291, 292. The sample for Vref 3/8 is divided by 3 and the samples are compared by comparator 293. Calibration logic 294 determines if the value is too low or too high. Controller 288 is used to and adjusts the bits of Vref/8 over line 295 as necessary.

The same action occurs for Vref/32, dividing the vref sample by 12 to get Vref/32.

Figure 3:
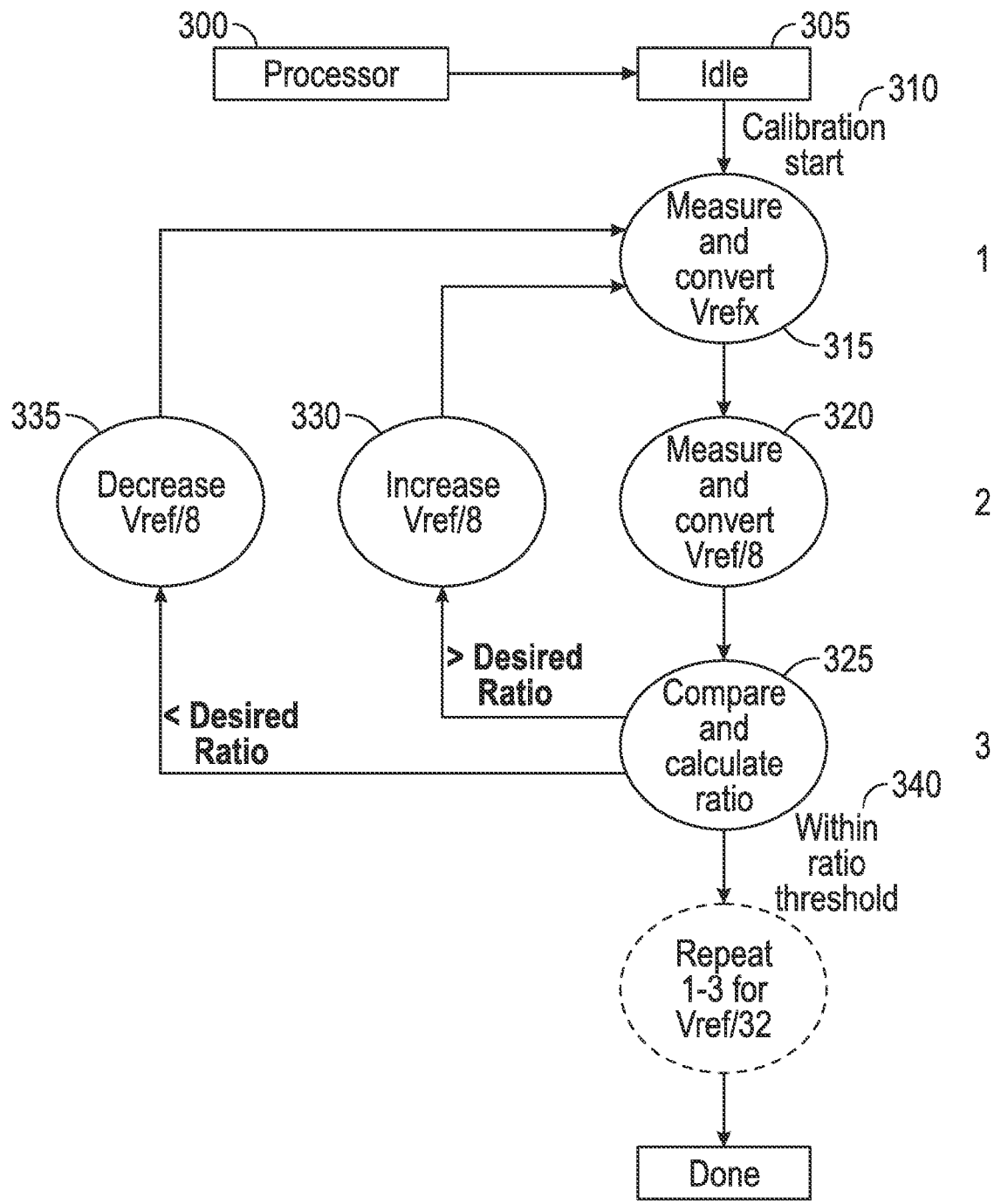
FIG. 3 shows a state machine embodiment.

The above shows doing this in dedicated circuitry, however, this can also be done on a generalized state machine, e.g., running in hardware via a DSP or FPGA, or in a processor 300, as shown in FIG. 3.

FIG. 3 shows the processor 300 executing the actions, starting from its normal idle state 305, when calibration start occurs at 310. The operation starts by measuring and converting Vref n/8 or more generally, Vref $m/2^n$ at 315.

At 320, Vref/8 is measured and converted. The values Vref n/8 and Vref/8 are compared at 325. In an embodiment, where Vref 3/8 is used, the ratio should be 3. If the ratio is too low, this means that Vref/8 is not high enough, and hence Vref/8 is increased at 330. The measuring conversion continues. If the ratio is too high, then Vref/8 is decreased at 335. If the ratio is within the ratio threshold at 340, then the value of Vref is taken to be correct. The steps 1 through 3 are then repeated at 345 for Vref/32.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other kinds of circuits can be controlled in this way.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, displayport, or any other form. This may include laptop or desktop computers, and may also include portable computers, including cell phones, tablets such as the IPAD™, and all other kinds of computers and computing platforms.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims.

The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A system comprising:
   a plurality of analog to digital converters, which convert analog to digital values, and which share one or more common adjustable reference voltages which are used in the convert;
   a reference generation circuit which generates the reference voltages and adjusts the reference voltages;
   at least one of said analog to digital converters having inputs which are switched to receive multiple ones of said reference voltages; and
   a control circuit that controls connecting said multiple ones of said reference voltages to said at least one of said analog to digital converters, and adjusts at least one of said reference voltages to obtain a set ratio between said multiple ones of said reference voltages.

2. The system as in claim 1, wherein a first of said multiple ones of the reference voltages applied to the analog-to-digital converters is a full-scale voltage V ref multiplied by $m/2^n$, where $m/2^n<1$, and m and n are any whole numbers.

3. The system as in claim 2, wherein a second of said multiple ones of the reference voltages applied to the analog-to-digital converters is a divided voltage ref $Vref/2^n$.

4. The system as in claim 1, wherein a first of said multiple ones of the reference voltages applied to the analog-to-digital converters is a full-scale voltage V ref multiplied by $m/8$.

5. The system as in claim 4, wherein a second of said multiple ones of the reference voltages applied to the analog-to-digital converters is $Vref/8$.

6. The system as in claim 5, wherein a third of said multiple ones of the reference voltages applied to the analog-to-digital converters is $Vref/32$.

7. The system as in claim 1, wherein said control circuit is a processor.

8. A method of calibrating an A/D converter comprising:
   obtaining adjustable reference voltages which are used in A/D conversion; comparing a first divided reference voltage of a full range voltage Vref, with a second divided reference voltage of Vref using analog to digital converters that are used in the A/D conversion; and
   adjusting at least one of said reference voltages to obtain a set ratio between said multiple ones of said reference voltages.

9. The method as in claim 8, wherein said first divided reference voltage is Vref multiplied by $m/2^n$, where $m/2^n<1$, and m and n are any whole numbers.

10. The method as in claim 9, wherein said second divided reference voltage is $Vref/2^n$, and where said adjusting adjusts $Vref/2^n$.

11. The method as in claim 8, wherein said first divided reference voltage is Vref multiplied by $m/8$.

12. The method as in claim 11, wherein said second divided reference voltage is $Vref/8$ and where said adjusting adjusts $Vref/8$.

13. The method as in claim 12, further comprising comparing a third divided reference voltage of $Vref/32$ and where said adjusting adjusts $Vref/32$.

* * * * *